US006160340A

United States Patent [19]

Guo et al.

[11] Patent Number: 6,160,340

[45] Date of Patent: Dec. 12, 2000

[54] MULTIFREQUENCY ULTRASONIC TRANSDUCER FOR 1.5D IMAGING

[75] Inventors: Xiaocong Guo, Woodinville; Christopher S. Chapman, Redmond; Qinglin Ma, Bothell, all of Wash.

[73] Assignee: Siemens Medical Systems, Inc., Iselin, N.J.

[21] Appl. No.: 09/196,609

[22] Filed: Nov. 18, 1998

[51] Int. Cl.[7] .......... H01L 41/04

[52] U.S. Cl. .......... 310/334; 310/335

[58] Field of Search .......... 310/334, 335, 310/336, 337, 327

[56] References Cited

U.S. PATENT DOCUMENTS

| | | | |
|---|---|---|---|
| 4,961,176 | 10/1990 | Tanaka et al. | 367/155 |
| 5,083,568 | 1/1992 | Shimazaki et al. | 310/335 |
| 5,091,893 | 2/1992 | Smith et al. | 367/153 |
| 5,099,459 | 3/1992 | Smith | 367/153 |
| 5,167,231 | 12/1992 | Matsui | 128/662.03 |
| 5,301,168 | 4/1994 | Miller | 367/138 |
| 5,410,208 | 4/1995 | Walters et al. | 310/334 |
| 5,546,946 | 8/1996 | Souquet | 600/459 |
| 5,575,290 | 11/1996 | Teo et al. | 128/661.1 |
| 5,617,865 | 4/1997 | Palczewska et al. | 128/662.03 |
| 5,637,800 | 6/1997 | Finsterwald et al. | 73/642 |
| 5,640,370 | 6/1997 | Hanafy et al. | 367/140 |
| 5,651,365 | 7/1997 | Hanafy et al. | 128/662.03 |
| 5,704,105 | 1/1998 | Venkataramani et al. | 29/25.35 |
| 5,740,806 | 4/1998 | Miller | 128/661.01 |
| 5,743,855 | 4/1998 | Hanafy et al. | 600/459 |
| 5,757,727 | 5/1998 | Hanafy et al. | 367/155 |
| 5,764,596 | 6/1998 | Hanafy et al. | 367/153 |
| 5,882,309 | 3/1999 | Chiao et al. | 600/459 |
| 5,920,523 | 7/1999 | Hanafy et al. | 367/140 |

*Primary Examiner*—Nestor Ramirez
*Assistant Examiner*—Peter Medley

[57] ABSTRACT

An ultrasonic transducer has a center row of transducers operating at a center row frequency and first and second outer rows of transducers operating at a common frequency or different frequencies lower than the center row frequency. In an enhancement of the ultrasonic transducer array, the center row of transducers has a matching layer with an acoustic velocity that is higher than matching layers that are associated with the first outer row and second outer row transducers. The matching layers can be selected such that the overall thickness of the transducer array is constant. A 1.5D ultrasonic transducer array operating at a higher center frequency and lower outer frequencies is adjustable to allow high resolution near field imaging in addition to better far field imaging without the need for a 2D transducer array.

18 Claims, 4 Drawing Sheets

MULTIFREQUENCY ULTRASONIC TRANSDUCER FOR 1.5D IMAGING

BACKGROUND OF THE INVENTION

The invention relates to an ultrasonic transducer array and more particularly to an ultrasonic transducer array for 1.5D imaging.

DESCRIPTION OF THE RELATED ART

Ultrasonic imaging techniques may be used to produce images of internal features of an object, such as tissues of a human body. A diagnostic ultrasonic imaging system for medical use forms images of internal tissues of the human body by electrically exciting an acoustic transducer element or an array of acoustic transducer elements to generate short ultrasonic pulses that propagate into the body. The ultrasonic pulses produce echoes as they reflect off body tissues that present discontinuities or impedance changes to the propagating ultrasonic pulses. These echoes return to the imaging transducer and are converted into electrical signals that are amplified and decoded to form a cross-sectional image of the tissue. Ultrasonic imaging systems provide physicians with real-time images of the internal features of the human anatomy without resort to more invasive exploratory techniques, such as surgery.

Acoustic imaging transducers which generate the ultrasonic pulses typically include a piezoelectric element or a matrix of piezoelectric elements. As known in the art, a piezoelectric element deforms in response to variations in the potential difference across the piezoelectric material, thereby producing ultrasonic pulses. In a similar manner, received echoes cause the piezoelectric element to deform and generate corresponding electrical signals. The acoustic imaging transducer is often packaged within a portable or handheld device that allows a sonographer substantial freedom to easily manipulate the imaging transducer over an area of interest. The imaging transducer is typically connected via a cable to a central control device that processes received electrical signals to form frames of image information. The control device transmits the image information to a real-time viewing device, such as a video display terminal. The frames of image information may also be stored for later viewing or combined with other frames to form a three-dimensional image.

It is desirable within the ultrasonic imaging art to provide an image that shows anatomical features of a particular region of interest at a selected imaging depth (i.e., elevation plane) within the patient. One way to provide such an image is to utilize a transducer comprising a two-dimensional array of piezoelectric elements that are individually driven by separate electrical signals. In the operation of the two-dimensional array, the phases and amplitudes of the signals applied to individual piezoelectric elements can be controlled in order to produce an ultrasonic beam that is focused and steered to the region of interest. Echoes received at the individual piezoelectric elements are combined and processed in a manner that yields a net signal characterizing the region of interest within a patient.

Although a two-dimensional array enables highly accurate focusing and beam steering capability in the elevation plane, such systems are far more complicated to control and operate than a one-dimensional or linear transducer array. In order to obtain elevation plane focusing without the complexity of two-dimensional transducer arrays, multi-row transducer arrays have been configured to provide limited two-dimensional focusing. Adjustments of the elevation plane focusing are achieved by varying the number of piezoelectric element rows used for transmitting and receiving ultrasonic information. This is in contrast to conventional one-dimensional transducer arrays that provide fixed focusing in the elevational plane by transmitting acoustic energy from a constant number of rows. Images formed from limited two-dimensional focusing are referred to as 1.5D images, since they approximate, but do not quite realize, a two-dimensional (2D) image.

One variable of a transducer array, whether it be 1D, 1.5D, or 2D, that determines the resolution of an image and the depth to which ultrasonic energy can penetrate a medium is the frequency of the ultrasonic pulses that are generated from transducer elements. As is known in the art, higher frequency ultrasonic energy has relatively high near field resolution, but a reduced ability to penetrate into a medium such as the human body. On the other hand, lower frequency ultrasonic energy has a relatively lower resolution, but a greater ability to penetrate into the human body. As described above, 1D and 1.5D imaging systems operate at a single frequency of ultrasonic energy. In order to enhance the performance of prior art 1.5D ultrasonic imaging systems, the single frequency used for imaging is selected as a compromise between the need for quality image resolution and the need to penetrate an adequate depth into the body to capture a desired image.

Another variable that affects the operation of a transducer array is acoustic reflection at the interface of the transducer and the body into which the acoustic energy is to penetrate. Acoustic reflection is caused when acoustic waves encounter a change in acoustic impedance. Acoustic reflection at the transducer-body interface presents a problem for efficient operation of a piezoelectric transducer used for medical imaging, because the acoustic impedance of the transducer may differ from the acoustic impedance of a human body by a factor of 20 or more. Acoustic reflection can be reduced by utilizing a matching layer having a thickness of one-quarter the wavelength of the operating frequency of the transducer element and having an acoustic impedance equal to the square root of the product of the acoustic impedances of the transducer element and the medium of interest (i.e., the human body), where the acoustic impedance of a medium is the product of the medium's density and the medium's acoustic velocity. The efficiency of transmitting acoustic energy can be further increased by gradually changing the acoustic impedance between a transducer element and the human body by, for example, using two different matching layers, one on top of the other. Since matching layer characteristics (i.e., thickness, acoustic velocity, and acoustic impedance) are related to the frequency of the acoustic energy generated by the transducer elements and since prior art 1D and 1.5D imaging arrays operate at a single frequency, prior art imaging systems apply the same matching layer material to all transducer elements in the imaging system.

In view of the operational advantages of 1.5D transducer arrays over 2D transducer arrays, but in further view of the limitations in image quality and image depth achievable with a 1.5D transducer array operating using conventional techniques, what is needed is a transducer array that maintains the simplicity of prior art 1.5D transducers while providing improved image quality and imaging depth.

SUMMARY OF THE INVENTION

An apparatus and method for performing ultrasonic imaging utilize a ultrasonic transducer array having a center row of transducer elements operating at a center row frequency and first and second outer rows of transducer elements operating at frequencies that are less than the center row frequency. In an enhancement of the 1.5D ultrasonic transducer array, an impedance matching assembly that is aligned with the center row establishes an acoustic velocity greater than that of the outer rows, but the overall thickness of the transducer array is constant across all rows.

In a preferred embodiment, a 1.5D ultrasonic transducer array includes at least the three distinct rows of piezoelectric members formed on a backing material. The frequency of ultrasonic energy generated from each piezoelectric member is related to the thickness of the member, with a thicker piezoelectric member generating a lower ultrasonic frequency. In addition, the preferred transducer array has a dual matching layer stack formed over each piezoelectric member. Matching layer stacks provide better acoustic energy transitions from the relatively high acoustic impedance of the piezoelectric members to the relatively low acoustic impedance of the body that is to be imaged. The matching layers directly adjacent to the piezoelectric members are referred to as the first matching layers and the matching layers formed on top of the first matching layers are referred to as the second matching layers. The piezoelectric members and the matching layer stacks are formed by conventional techniques and are extremely thin relative to the backing.

The center row of transducer elements generates ultrasonic energy at a higher center frequency than the ultrasonic energy that is generated by the two outer rows of transducer elements. This is in contrast to the conventional 1.5D transducer arrays which generate ultrasonic energy at a single frequency from all transducer elements. Because the center row and outer row piezoelectric members generate ultrasonic energy at different center frequencies, different matching layer materials are used to complement the different piezoelectric members. Specifically, the acoustic velocities of the two center row matching layers are higher than the corresponding acoustic velocities of the two outer row matching layers. Utilizing matching layers with different acoustic velocities for the different piezoelectric members allows the individual matching layer thicknesses to be adjusted such that the overall thickness of the transducer array is constant. Although a constant overall transducer array thickness is not required, it facilitates fabrication and enhances reliability in performance, since the entire surface should contact the body into which the acoustic energy is to be transmitted.

Typically, the transducer array includes an odd number of rows of transducer elements. The two rows that are equidistant from the center row generate acoustic energy at the same center frequency and may be identically connected to circuitry for providing excitation signals and for processing received echo signals. Thus, by varying the number of rows that are activated, focusing in the elevation plane can be varied.

In a preferred embodiment on which the transducer array is used to image the human body, the piezoelectric members have thicknesses that range from $\lambda/2$ to $\lambda/4$, where $\lambda$ is the center wavelength of the ultrasonic energy generated from the respective piezoelectric members, and the piezoelectric members have acoustic impedances of approximately 30 MRayls. The first matching layers have thicknesses that range from $\lambda/4$ to $\lambda/8$ and have acoustic impedance of approximately 5 to 8 MRayls. The second matching layers have thicknesses that range from $\lambda/4$ to $\lambda/8$ and have acoustic impedances of approximately 3 MRayls.

An advantage of the invention is that higher frequency ultrasonic energy provides higher image resolution in a near field, while lower frequency ultrasonic energy provides deeper penetration into objects such as the human body. By utilizing different center frequencies between center row transducers and outer row transducers in a 1.5D array, the benefits of both the higher and lower frequency ultrasonic energy are realized without the costs associated with producing a 2D array.

Although the invention is preferably implemented in a 1.5D transducer array, operating transducer rows at different frequencies and applying row/frequency specific matching layers to the transducer rows can be applied to other transducer arrays such as 1.75D and 2D arrays.

DETAILED DESCRIPTION

Figure 1:
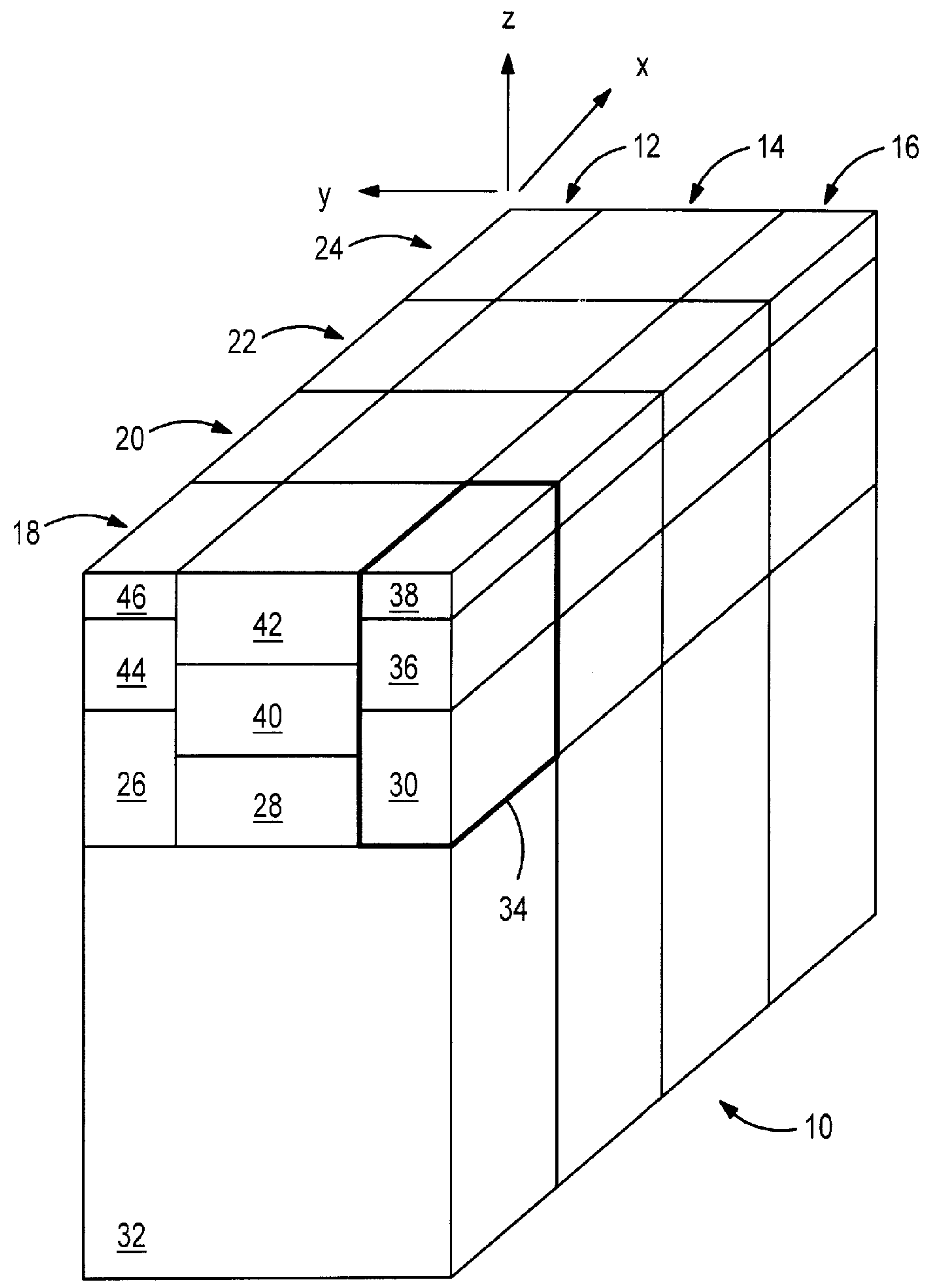
FIG. 1 is a depiction of a preferred embodiment of a 1.5D transducer array with double matching layers in accordance with the invention.

FIG. 1 is a depiction of a preferred embodiment of a 1.5D transducer array 10, but the various components of the array are not drawn to scale. As shown in FIG. 1, transducer rows 12, 14 and 16 extend along the x (or azimuth) axis, transducer columns 18, 20, 22 and 24 extend along the y (or elevation) axis, and ultrasonic energy is emitted from the transducer generally along the z (or range) axis. While only three rows are included in this embodiment, the 1.5D transducer array may include additional rows, such as fourth and fifth rows on opposite sides of the illustrated three-row embodiment.

Figure 2:
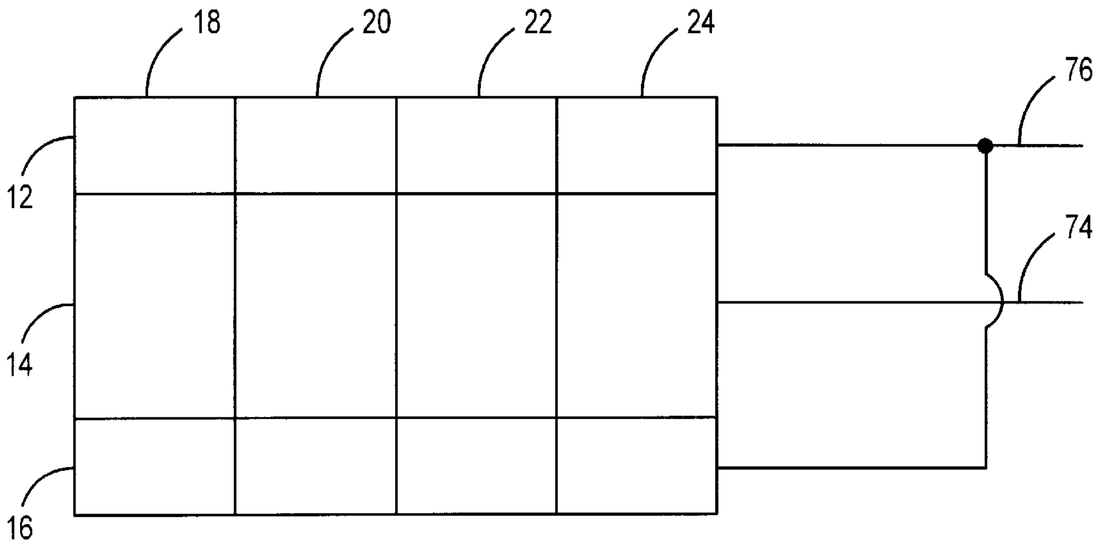
FIG. 2 is a depiction of the transducer interconnects for the 1.5D transducer array.

As is known in the art, a 1.5D transducer array 10 differs from a 2D array with respect to connections to circuitry for providing drive signals and circuitry for processing echo signals. The connectivity and the operation for a 1.5D array are described in U.S. Pat. No. 5,575,290 to Teo et al., U.S. Pat. No. 5,617,865 to Palczewska et al., and U.S. Pat. No. 5,740,806 to Miller, each of which is assigned to the assignee of the present invention. Rather than a separate connection to each transducer element in the elevation direction of the array (as in a 2D transducer), the transducer elements of the 1.5D array have common connections among the outer row transducer elements, as shown by the center row connection 74 and common outer row connection 76 of FIG. 2, where FIG. 2 is a plan view of the 1.5D transducer array of FIG. 1. As shown in FIG. 2, the center row transducer elements can be controlled independently of the outer row transducer elements. The outer rows are controlled in tandem by the common connection. Additional pairs of outer rows with common connections can be added to the 1.5D array in accordance with the invention. Further, the elements may be controlled on a column basis or on a row basis. Control on a column basis may require connections such as 74 and 76 for each column of transducers in the array.

Each transducer element in the 1.5D array 10 includes a piezoelectric member 26, 28 and 30 and a matching layer stack. The piezoelectric members are in contact with a backing member 32. One transducer element 34 is shown in a darkened border in FIG. 1. The transducer element consists of the piezoelectric member 30 and two matching layers 36 and 38.

In the preferred embodiment, the piezoelectric members 26, 28 and 30 are formed from lead zirconate titanate (PZT) and preferably PZT-5. Other materials that may be used to form the piezoelectric members include lead titanate, lead metaniobate ($PbNb_2O_6$), polyvinylidene fluoride (PVDF), and 1–3 composite, although the selection of the material is not critical to the invention. In fact, piezoelectric material is not critical, since other types of materials for generating ultrasonic energy in response to applied signals are known.

The matching layers 36, 38, 40, 42, 44 and 46 are formed on top of the piezoelectric members 26, 28 and 30 from conventional matching layer material, such as graphite or epoxy. The desired characteristics of each matching layer are selected based upon the wavelength of ultrasonic energy emitted from the piezoelectric member aligned with the matching layer and based upon the acoustic velocities and acoustic impedances of the piezoelectric member and the body into which the ultrasonic energy is to be transmitted. Acoustic velocity is a measure of the velocity with which sound waves travel through a material. Acoustic impedance is a material property that is defined as the product of the acoustic velocity of the material and the density of the material. The relative transmission and reflection of acoustic energy at an interface is governed in part by the acoustic velocity and the acoustic impedance of the material on each side of the interface. Conventionally, a measure of impedance is designated by the letter "Z" and is expressed in kilograms per second times meter squared ($kg/m^2s$) or Rayls, where water has an acoustic impedance of 1.49 MRayls.

As previously noted, there are at least three distinct rows 12, 14 and 16 of piezoelectric members 26, 28 and 30 formed on the backing member 32, the center row piezoelectric members 28, the first outer row piezoelectric members 26, and the second outer row piezoelectric members 30. The frequency of ultrasonic energy generated from the piezoelectric members is related to the thickness of the members, whereby a thicker piezoelectric member generates a lower ultrasonic frequency. In addition, the preferred transducer array 10 has dual matching layers 36–46 formed over the piezoelectric members. Dual matching layers provide for better acoustic energy transition from the relatively high acoustic impedance of the piezoelectric members to the relatively low acoustic impedance of the body that is to be imaged. The matching layers directly adjacent to the piezoelectric members are referred to as the first matching layers 36, 40 and 44 and the matching layers formed on top of the first matching layers are referred to as the second matching layers 38, 42, and 46. Both the piezoelectric members and the matching layers are formed by conventional techniques and are extremely thin relative to the backing member 32.

Important aspects of the invention are the frequencies of ultrasonic energy generated from the piezoelectric members 26–30 and the acoustic properties of the matching layers 36–46 that are used in conjunction with the piezoelectric members. In a preferred embodiment, the center row 14 of piezoelectric members 28 generates ultrasonic energy at a higher center frequency than the ultrasonic energy that is generated by the two outer rows 12 and 16 of piezoelectric members 26 and 30. This is in contrast to the conventional 1.5D transducer arrays which generate ultrasonic energy from all transducer elements at a single center frequency.

As stated above, higher frequency ultrasonic energy provides higher image resolution in a near field, while lower frequency ultrasonic energy provides a deeper focus into objects, such as the human body. By utilizing different center frequencies for the center row 14 and the outer rows 12 and 16 in the 1.5D array, the benefits of both the higher and lower frequency ultrasonic energy can be selectively achieved. The terms frequency and center frequency are used herein to refer to the center frequency in a typical frequency distribution generated by the transducer elements.

Because the center row 14 and outer rows 12 and 16 of piezoelectric members 26, 28 and 30 generate ultrasonic energy at different center frequencies, different matching layer materials are also used to complement the different ultrasonic energy frequencies. Specifically, the acoustic velocities of the center row matching layers 40 and 42 are selected to be higher than the corresponding acoustic velocities of the outer row matching layers 36, 38, 44 and 46. Utilizing matching layers with acoustic velocities that are tailored for the different piezoelectric members allows the individual matching layer thicknesses to be adjusted such that the overall thickness along the z axis of the transducer array is constant. Although constant overall thickness is not required, it reduces complexities related to both fabrication and use, since the exterior surface should contact the object to be imaged.

In a preferred embodiment in which the transducer array 10 is used to image tissue within the human body, the piezoelectric members 26–30 have thicknesses that range from $\lambda/2$ to $\lambda/4$ (where $\lambda$ is the center wavelength of the ultrasonic energy generated from the respective piezoelectric members) and the piezoelectric members have acoustic impedances of approximately 30 MRayls. The first matching layers 36, 40 and 44 have thicknesses that range from $\lambda/4$ to $\lambda/8$ and have acoustic impedances of approximately 5–8 MRayls. The second matching layers 38, 42, and 46 have thicknesses that range from $\lambda/4$ to $\lambda/8$ and have acoustic impedances of approximately 3 MRayls.

Figure 3:
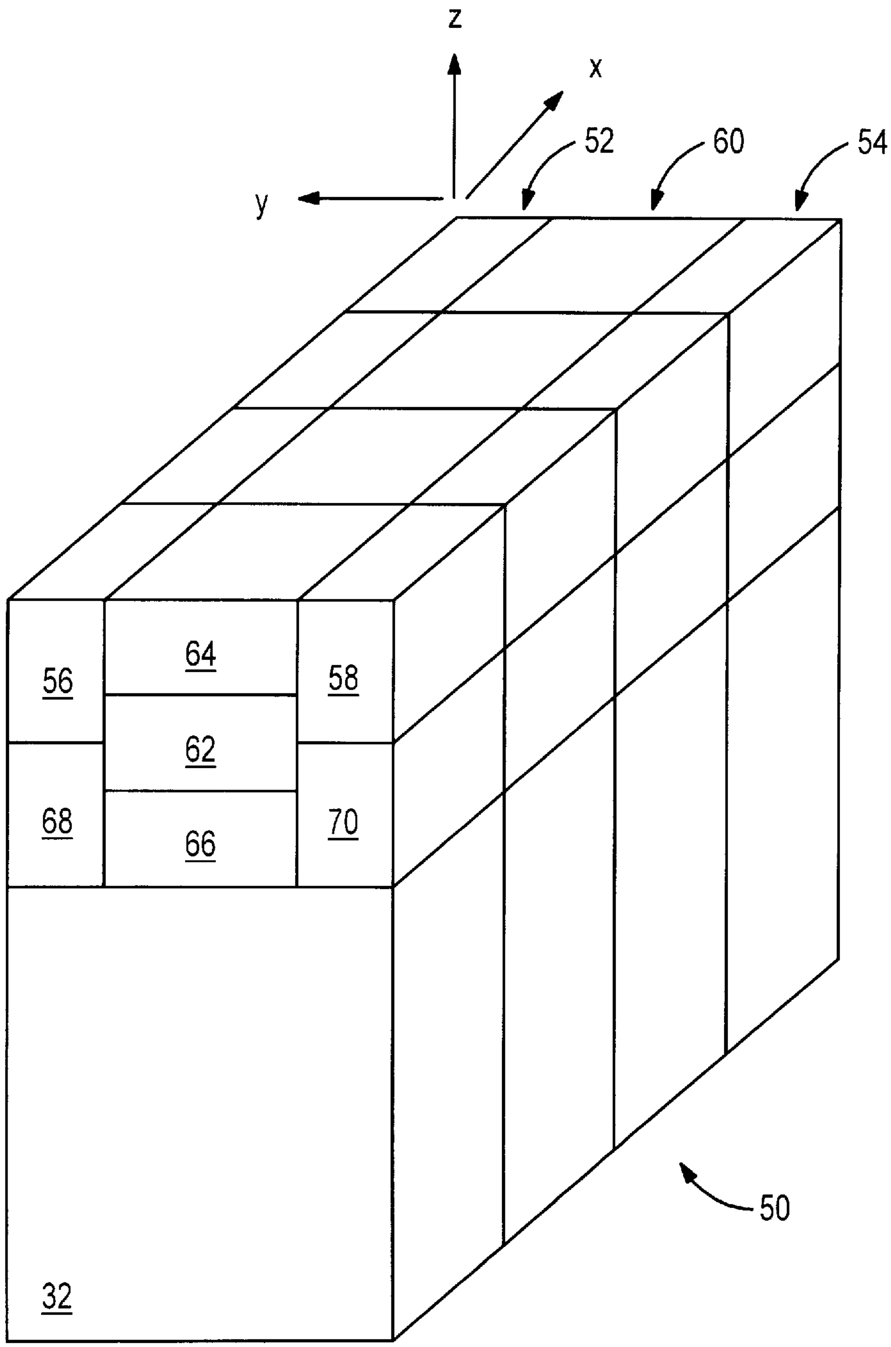
FIG. 3 is a depiction of a preferred embodiment of a 1.5D transducer array with double center row matching layers and single outer row matching layers in accordance with the invention.

The 1.5D transducer array 10 as depicted in FIG. 1 may be a 3.5 MHz array or a 10 MHz array, where 3.5 MHz and 10 MHz arrays are common medical imaging frequencies. However, the frequencies are not critical. Preferred specifications of an exemplary 10 MHz 1.5D ultrasonic transducer array in accordance with the invention are as follows:

Operating Frequency
- center row transducer elements: 10 MHz
- outer row transducer elements: 8 MHz Acoustic Impedance
- backing member: 3–5 MRayls
- piezoelectric members: 30 MRayls
- first matching layers: 5–8 MRayls
- second matching layers: 3 MRayls Acoustic Velocity
- backing member: approx. 1800 m/s
- piezoelectric members: approx. 4600 m/s
- center row first matching layer: approx. 3000–4000 m/s
- center row second matching layer: approx. 2000 m/s
- outer row first matching layers: approx. 2000–3000 m/s
- outer row second matching layers: approx. 1000 m/s Approximate Dimensions
- overall row length: 40 mm (128 elements)
- overall width: 3–4 mm
- backing thickness: 1 cm
- center row width: 0.5 mm outer row widths: 1.25–1.75 mm center row piezoelectric member thickness: 4–9 mils center row first matching layer thickness: 2–3 mils center row second matching layer thickness: 1–2 mils outer row piezoelectric member thickness: 4–9 mils outer row first matching layer thickness: 2–3 mils outer row second matching layer thickness: 1–2 mils FIG. 3 is a depiction of an alternative embodiment of a 1.5D transducer array 50 in accordance with the invention. In this embodiment, outer rows 52 and 54 have a single matching layer 56 and 58, while a center row 60 has double matching layers 62 and 64. Preferably, the acoustic velocities of the center and outer row matching layers are adjusted such that the overall thickness of the transducer array is constant. As with the 1.5D transducer array 10 of FIG. 1, the 1.5D array 50 of FIG. 3 operates with a center row frequency that is higher than the frequency of the outer rows. The 1.5D transducer array 50 preferably is of the 3.5 MHz or the 10 MHz type. For example, the middle piezoelectric members 66 may have a center frequency of 10 MHz, while the outer piezoelectric members 68 and 70 have a center frequency of 8 MHz. A preferred 3.5 MHz transducer array in either the FIG. 1 or FIG. 3 configurations operates at a center row frequency of 3.5 MHz and an outer row frequency of 2.8 MHz.

Although arrays having dual matching layers and a combination of dual and single matching layers are described, other numbers and arrangements of matching layers are possible. For example, a 1.5D transducer array may utilize only single matching layers. In addition, although 3.5 MHz and 10 MHz transducers are referred to, other frequency combinations are possible. Further, although transducer row arrangements are specified, other arrangements such as circular arrangements are possible.

Figure 4:
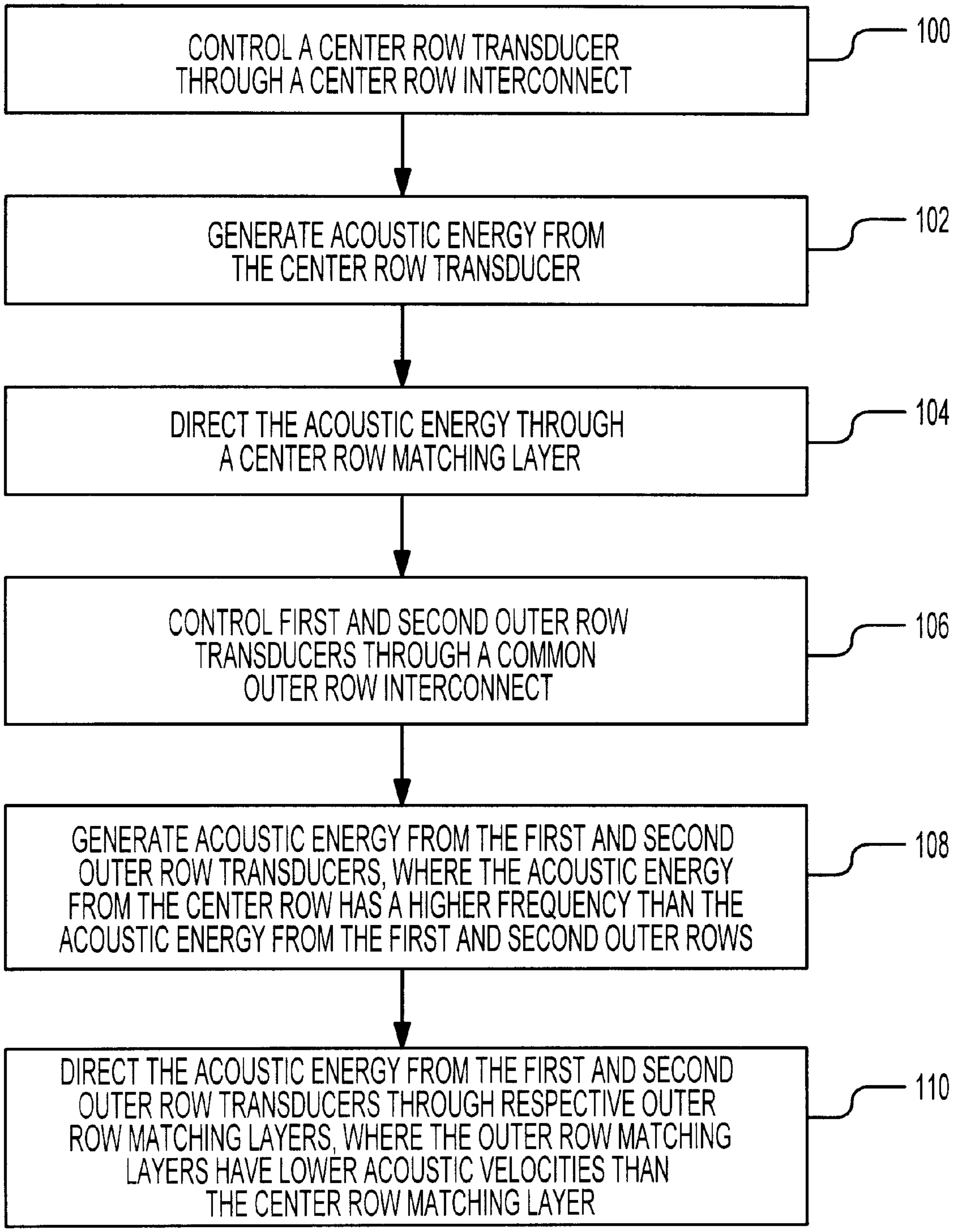
FIG. 4 is a process flow diagram of a preferred method of generating acoustic energy for 1.5D imaging in accordance with the invention.

FIG. 4 is a process flow diagram of a method of the invention. In a step 100, a center row transducer is controlled through a center row interconnect. In a step 102, acoustic energy is generated from the center row transducer at a center row frequency. In a step 104, the acoustic energy generated from the center row transducer is directed through a center row matching layer that has a center row matching layer acoustic velocity. In a step 106, first and second outer row transducers are controlled through a common outer row interconnect. While not included in FIG. 4, the step 106 of exciting the outer row transducers is typically preceded by a step of terminating the excitation of the center row transducers. Thus, refocusing in the elevation plane is accomplished. In a step 108, acoustic energy is generated from the first and second outer row transducers, where the acoustic energy generated from the center row has a higher frequency than the acoustic energy generated from the first and second outer rows. In a step 110, the acoustic energy from the first and second outer row transducers is directed through respective outer row matching layers, where the outer row matching layers have lower acoustic velocities than the acoustic velocity of the center row matching layer.

Although the invention is described specifically with reference to a 1.5D transducer array, operating transducer rows at different frequencies and applying row/frequency specific matching layers to the transducer rows can be applied to other transducer arrays such as 1.75D and 2D arrays.

What is claimed is:

1. An ultrasonic transducer array comprising:

a center row of middle transducer elements, each middle transducer element including a middle piezoelectric member and a first matching layer having a center row acoustic velocity, and being responsive to excitation signals to generate acoustic energy at a center row frequency;

a first outer row of first side transducer elements located along a first side of said center row, each of said first side transducer elements including a first side piezoelectric member and a first matching layer having a first side row acoustic velocity, and being responsive to excitation signals to generate acoustic energy at a first outer row frequency; and a second outer row of second side transducer elements located along a second side of said center row, each of said second side transducer elements including a second side piezoelectric member and a first matching layer having a second side row acoustic velocity, and being responsive to excitation signals to generate acoustic energy at a second outer row frequency;

wherein said center row frequency and acoustic velocity is significantly different from said first and second outer row frequencies and acoustic velocities, respectively.

2. The ultrasonic transducer array of claim 1 wherein said center row frequency is significantly greater than said first and second outer row frequencies, said first and second outer row frequencies being generally equal.

3. The ultrasonic transducer array of claim 2 wherein said center row acoustic velocity is greater than said first side and second side row acoustic velocities, said first and second side row acoustic velocities being generally equal.

4. The ultrasonic transducer array of claim 1 wherein said middle, first and second side transducer elements have a generally constant thickness.

5. The ultrasonic transducer array of claim 1 wherein each of said middle transducer elements includes a second matching layer on a side of said first matching layer opposite to said middle piezoelectric members, thereby forming a middle matching layer stack.

6. The ultrasonic transducer array of claim 5 wherein each of said first and second side transducer elements include a second matching layer having an acoustic velocity less than an acoustic velocity of said second matching layer of said middle transducer elements, each said first and second side transducer elements thereby having a side matching layer stack.

7. The ultrasonic transducer array of claim 6 wherein said middle piezoelectric members have a thickness less than a thickness of said first and second side piezoelectric members, said middle matching layer stack having a thickness greater than thicknesses of said side matching layer stacks such that said middle and said first and second side transducer elements have a generally equal total thickness.

8. The ultrasonic transducer array of claim 1 wherein said center row acoustic velocity is approximately 10 MHz and said first and second side row acoustic velocities are each approximately 8 MHz.

9. The ultrasonic transducer array of claim 1 wherein said center row acoustic velocity is approximately 3.5 MHz and said first and second side row acoustic velocities are each approximately 2.8 MHz.

10. A method of generating acoustic energy for 1.5D imaging with an ultrasonic transducer comprising steps of:

controlling activation of a center row transducer using a center row interconnect scheme;

generating higher frequency acoustic energy from said center row transducer;

directing said higher frequency acoustic energy through a center row matching layer that has a center row matching layer acoustic velocity;

controlling activation of a first outer row transducer and a second outer row transducer using a common outer row interconnect scheme, said first outer row transducer being on an opposite side of said center row transducer from said second outer row transducer;

generating lower frequency acoustic energy from said first and second outer row transducers at outer row frequencies that are lower than said center row frequency; and directing said lower frequency acoustic energy through respective first and second outer row matching layers that have acoustic velocities that are lower than said center row matching layer acoustic velocity.

11. The method of claim 10 further comprising a step of directing said higher frequency acoustic energy from said center row transducer through a second center row matching layer that has an acoustic velocity that is lower than said first center row matching layer acoustic velocity.

12. The method of claim 10 further comprising:

a step of directing said lower frequency acoustic energy from said first outer row transducer through a second matching layer, aligned with said first outer row transducer, that has an acoustic velocity that is lower than that of said first matching layer aligned with said first outer row; and a step of directing said lower frequency acoustic energy from said second outer row transducer through a second matching layer, aligned with said second outer row transducer, that has an acoustic velocity that is lower than that of said first matching layer aligned with said second outer row.

13. The method of claim 10 wherein:

said step of generating said higher frequency acoustic energy from said center row transducer is a step of generating acoustic energy centered at approximately 3.5 MHz; and said step of generating said lower frequency acoustic energy from said first and second outer row transducers is a step of generating acoustic energy centered at approximately 2.8 MHz.

14. The method of claim 10 wherein:

said step of generating said high frequency acoustic energy from said center row transducer is a step of generating acoustic energy centered at approximately 10 MHz; and said step of generating said lower frequency acoustic energy from said first and second outer row transducers is a step of generating acoustic energy centered at approximately 8 MHz.

15. A 1.5D ultrasonic transducer array comprising:

a center row of transducer elements including a center row matching layer aligned with said center row of transducer elements, said center row matching layer having an acoustic impedance between acoustic impedances of said center row transducer elements and an object to be imaged for generating acoustic energy at a center row frequency;

a first outer row of transducer elements including a first outer row matching layer aligned with said first outer row of transducer elements, said first row matching layer having an acoustic impedance between acoustic impedances of said first outer row transducer elements and said object for generating acoustic energy at a first outer row frequency, said first outer row being adjacent to said center row; and a second outer row of transducer elements including a second outer row matching layer aligned with said second outer row of transducer elements, said second row matching layer having an acoustic impedance between acoustic impedances of said second outer row transducer elements and said object for generating acoustic energy at a second outer row frequency, said second outer row being located adjacent to said center row of transducer elements and opposite said first outer row;

wherein said center row, first outer row, and second outer row of transducer elements have interconnections compatible with operation of a 1.5D transducer array and wherein said center row frequency and acoustic velocity is higher than said first outer row frequency and acoustic velocity and said second outer row frequency and acoustic velocity.

16. The 1.5D ultrasonic transducer array of claim 15 wherein the combined thickness of said center row of transducer elements and said center row matching layer is equivalent to the combined thickness of said first outer row of transducer elements and said first outer row matching layer and to the combined thickness of said second outer row of transducer elements and said second outer row matching layer.

17. The 1.5D ultrasonic transducer array of claim 15 further including:

an additional center row matching layer, connected to said first center row matching layer, having an acoustic velocity that is lower than said acoustic velocity of said first center row matching layer;

an additional first outer row matching layer, connected to said first outer row matching layer, having an acoustic velocity that is lower than said acoustic velocity of said first outer row matching layer; and an additional second outer row matching layer, connected to said second outer row matching layer, having an acoustic velocity that is lower than said acoustic velocity of said second outer row matching layer.

18. The 1.5D ultrasonic transducer array of claim 17 wherein the combined thickness of said center row of transducer elements, said center row matching layer, and said additional center row matching layer is equivalent to the combined thickness of said first outer row of transducer elements, said first outer row matching layer, and said additional first outer row matching layer, and to the combined thickness of said second outer row of transducer elements, said second outer row matching layer, and said additional second outer row matching layer.

* * * * *